(12) United States Patent
Zhong et al.

(10) Patent No.: US 8,673,163 B2
(45) Date of Patent: *Mar. 18, 2014

(54) METHOD FOR FABRICATING THIN SHEETS OF GLASS

(75) Inventors: John Z. Zhong, Cupertino, CA (US); Casey J. Feinstein, San Jose, CA (US); Steve Porter Hotelling, San Jose, CA (US); Shih Chang Chang, Hsinchu (TW)

(73) Assignee: Apple Inc., Cupertino, CA (US)

( * ) Notice: Subject to any disclaimer, the term of this patent is extended or adjusted under 35 U.S.C. 154(b) by 1094 days.

This patent is subject to a terminal disclaimer.

(21) Appl. No.: 12/163,701

(22) Filed: Jun. 27, 2008

(65) Prior Publication Data

US 2009/0324939 A1     Dec. 31, 2009

(51) Int. Cl.
    *C30B 33/00* (2006.01)
    *B44C 1/22* (2006.01)

(52) U.S. Cl.
    USPC ............... 216/23; 216/31; 216/83; 216/88; 249/156

(58) Field of Classification Search
    USPC ................... 216/23, 31, 83, 88; 249/156
    See application file for complete search history.

(56) References Cited

U.S. PATENT DOCUMENTS

| | | | |
|---|---|---|---|
| 5,483,261 A | 1/1996 | Yasutake | |
| 5,488,204 A | 1/1996 | Mead et al. | |
| 5,766,493 A | 6/1998 | Shin | |
| 5,816,225 A | 10/1998 | Koch et al. | |
| 5,825,352 A | 10/1998 | Bisset et al. | |
| 5,835,079 A | 11/1998 | Shieh | |
| 5,880,411 A | 3/1999 | Gillespie et al. | |
| 6,166,915 A | 12/2000 | Lake et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |

(Continued)

FOREIGN PATENT DOCUMENTS

| | | |
|---|---|---|
| CN | 1694589 A | 11/2005 |
| CN | 101025502 A | 8/2007 |

(Continued)

OTHER PUBLICATIONS

Ohkuma, Hideo; Development of a Manufacturing Process of a Thin, Lighweight LCD Cell, Department of Cell Process Development, IBM, Japan, Section 13.4.

(Continued)

*Primary Examiner* — Shamim Ahmed

(57) ABSTRACT

Fabrication of thin sheets of glass or other substrate material for use in devices such as touch sensor panels is disclosed. A pair of thick glass sheets, typically with thicknesses of 0.5 mm or greater each, may each be patterned with thin film on a surface, sealed together to form a sandwich with the patterned surfaces facing each other and spaced apart by removable spacers, either or both thinned on their outside surfaces to thicknesses of less than 0.5 mm each, and separated into two thin glass sheets. A single thick glass sheet, typically with a thickness of 0.5 mm or greater, may be patterned, covered with a protective layer over the pattern, thinned on its outside surface to a thickness of less than 0.5 mm, and the protective layer removed. This thinness of less than 0.5 mm may be accomplished using standard LCD equipment, despite the equipment having a sheet minimum thickness requirement of 0.5 mm.

9 Claims, 6 Drawing Sheets

(56) References Cited

U.S. PATENT DOCUMENTS

| | | |
|---|---|---|
| 6,327,011 B2 | 12/2001 | Kim |
| 6,350,664 B1 | 2/2002 | Haji et al. |
| 6,690,387 B2 | 2/2004 | Zimmerman et al. |
| 6,955,971 B2 | 10/2005 | Ghyselen et al. |
| 7,015,894 B2 | 3/2006 | Morohoshi |
| 7,184,064 B2 | 2/2007 | Zimmerman et al. |
| 7,663,607 B2 | 2/2010 | Hotelling et al. |
| 7,918,019 B2 | 4/2011 | Chang et al. |
| 2003/0057183 A1* | 3/2003 | Cho et al. ............... 216/23 |
| 2004/0142118 A1 | 7/2004 | Takechi |
| 2005/0245165 A1 | 11/2005 | Harada et al. |
| 2006/0026521 A1 | 2/2006 | Hotelling et al. |
| 2006/0097991 A1 | 5/2006 | Hotelling et al. |
| 2006/0197753 A1 | 9/2006 | Hotelling |
| 2006/0250559 A1* | 11/2006 | Bocko et al. ............. 349/139 |
| 2006/0292822 A1 | 12/2006 | Xie |
| 2007/0196578 A1 | 8/2007 | Karp et al. |
| 2008/0135175 A1* | 6/2008 | Higuchi ................... 156/344 |
| 2008/0261057 A1* | 10/2008 | Slobodin ................. 428/447 |
| 2009/0091551 A1 | 4/2009 | Hotelling et al. |
| 2011/0030209 A1 | 2/2011 | Chang et al. |

FOREIGN PATENT DOCUMENTS

| | | |
|---|---|---|
| CN | 101206314 A | 6/2008 |
| EP | 1 592 073 * | 11/2005 |
| EP | 1 592 073 A1 | 11/2005 |
| JP | 52-031757 A | 3/1977 |
| JP | 05249422 | 9/1993 |
| JP | 52031757 | 3/1997 |
| JP | 09-312245 A | 12/1997 |
| JP | 2000-163031 A | 6/2000 |
| JP | 2002-342033 A | 11/2002 |
| WO | WO-2009/003029 A2 | 12/2008 |
| WO | WO-2010/080988 A2 | 7/2010 |
| WO | WO-2010/080988 A3 | 7/2010 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

International Search Report mailed Jul. 21, 2010, for PCT Application No. PCT/US2010/020485, filed Jan. 8, 2010, six pages.

Non Final Office Action mailed May 18, 2010, for U.S. Appl. No. 12/351,767, five pages.

Notice of Allowance mailed Sep. 17, 2010, for U.S. Appl. No. 12/351,767, six pages.

* cited by examiner

METHOD FOR FABRICATING THIN SHEETS OF GLASS

FIELD OF THE INVENTION

This relates generally to the fabrication of thin sheets of substrate material, and more particularly, to the fabrication of thin sheets of glass.

BACKGROUND OF THE INVENTION

The standard process for fabricating LCD panels involves, inter alia, sealing two transparent substrates together to form a sandwich for depositing liquid crystal therebetween, thinning the sandwich to an appropriate LCD panel thickness, and depositing thin film on the outside surfaces of the sandwich. Conventional substrates are made from sheets of glass or some other transparent material. In order to withstand the chemical and mechanical rigors of fabrication without deformation or damage, a conventional sheet is generally at least 0.5 mm thick. Because 0.5 mm is the thinnest dimension for the sheets being used, standard LCD fabrication equipment has been designed to have a minimum thickness tolerance of 0.5 mm. This means that any sheet fabricated using standard LCD technology should have a thickness of at least 0.5 mm in order to be handled properly.

In recent years, touch sensor panels, touch screens, and the like have become available as input devices. Touch screens, in particular, are becoming increasingly popular because of their ease and versatility of operation as well as their declining price. Touch screens can include a touch sensor panel, which can be a clear panel with a touch-sensitive surface, and a display device, such as an LCD panel, that can be positioned partially or fully behind the touch sensor panel so that the touch-sensitive surface can cover at least a portion of the viewable area of the display device. Touch screens can allow a user to perform various functions by touching the touch sensor panel using a finger, stylus or other object at a location dictated by a user interface (UI) being displayed by the display device. In general, touch screens can recognize a touch event and the position of the touch event on the touch sensor panel, and a computing system can then interpret the touch event in accordance with the display appearing at the time of the touch event, and thereafter can perform one or more actions based on the touch event.

Like LCD panels, touch sensor panels in touch screens may be made of glass or other suitable transparent material. However, unlike LCD panels, touch sensor panels may be generally very thin, much more so than LCD panels. Fabrication technology can be similar for both touch sensor panels and LCD panels. However, due to touch sensor panel thinness, difficulties can occur in fabricating them using the same equipment as that used for LCD fabrication because the touch sensor panels may not fit the equipment and/or may be too fragile to withstand the rigors of the fabrication process. As such, equipment specifically designed for fabricating touch screen panels may be needed, which can be very expensive.

SUMMARY OF THE INVENTION

This relates to the fabrication of thin sheets of glass or other substrate material for use in devices such as touch sensor panels. In some embodiments, fabrication can be achieved using standard LCD technology. Standard equipment for fabrication of LCD panels has been designed with a minimum thickness tolerance of 0.5 mm. This is because glass (or other transparent material) used to fabricate LCD panels should be at least 0.5 mm thick in order to withstand the rigors of fabrication. Thinner glass would be subject to deformation or damage.

To fabricate thin sheets of glass, a pair of thick glass sheets may be provided, typically with thicknesses of 0.5 mm or greater each. Patterns of thin film may be deposited on a surface of each glass sheet for use as conductive traces, anti-reflective material, and/or protective layering, for example. The pair of thick glass sheets may be sealed together to form a sandwich with their patterned surfaces facing each other and separated by removable spacers. Either or both of the sandwiched thick glass sheets may be thinned on their respective outside surfaces to thicknesses of less than 0.5 mm each. The sandwich of now thin glass sheets may be separated from each other. Either or both sheets may have thicknesses less than the minimum thickness requirement for standard LCD equipment, yet be fabricated using that same equipment.

To fabricate thin sheets of glass, a thick glass sheet may be provided, typically with a thickness of 0.5 mm or greater. Patterns of thin film may be deposited on a surface of the glass sheet for use as described previously. A removable protective layer may be placed over the patterned thin film. The thick glass sheet may be thinned on its outside surface opposite the protective layer surface to a thickness of less than 0.5 mm. The protective layer may be removed. The sheet may have a thickness less than the minimum thickness requirement for standard LCD equipment, yet be fabricated using that same equipment.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the invention.

This relates to the fabrication of thin sheets of glass or other substrate material for use in devices such as touch sensor panels. In some embodiments, fabrication can be achieved using standard LCD technology. Standard equipment for fabrication of LCD panels has been designed with a minimum thickness tolerance of 0.5 mm. This is because glass (or other transparent material) used to fabricate LCD panels should be at least 0.5 mm thick in order to withstand the rigors of fabrication. Thinner glass would be subject to deformation or damage.

Touch sensor panels may be significantly thinner than LCD panels, but use similar fabrication methods. Therefore, using standard LCD technology to fabricate touch sensor panels may substantially save time, cost, and labor. However, to do so, the touch sensor panels should meet the minimum thickness tolerance of LCD equipment. One way to do so may be by forming a sandwich of two sheets such that the combined thickness of the sandwich during fabrication does not drop below 0.5 mm. As such, each sheet in the sandwich can be thinned during fabrication to a thickness of less than 0.5 mm. Another way to do so may be by applying a protective layer to a sheet such that the combined thickness during fabrication does not drop below 0.5 mm. As such, the sheet can be thinned during fabrication to a thickness of less than 0.5 mm. After thinning, the sheets can be separated, resulting in separate sheets that are thinner than could be achieved had the sandwich not been formed. This process can result in thin glass sheets suitable for touch sensor panels. Moreover, for the pairs of sheets, the throughput may increase substantially because two thin sheets may be processed at once.

Although embodiments of this invention are described and illustrated herein in terms of touch sensor panels with glass substrates, it should be understood that embodiments of this invention are not so limited to such panels and substrates, but is generally applicable to panels utilizing other touch and proximity sensing technologies, and any substrate for which thinness is required.

Figure 1A:
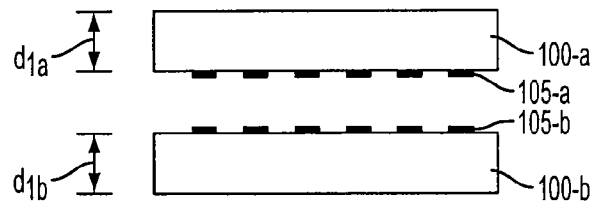
FIG. 1a illustrates an exemplary pair of thick glass sheets patterned with thin film on a surface according to embodiments of the invention.

FIG. 1a illustrates an exemplary pair of thick glass sheets patterned with thin film on a surface according to embodiments of the invention. In the example of FIG. 1a, thick glass sheet 100-a may have a thickness of $d_{1a}$ and thick glass sheet 100-b may gave a thickness of $d_{1b}$. Thicknesses $d_{1a}$ and $d_{1b}$ may or may not be the same. Conventional thick glass sheets may typically be 0.5 mm thick or greater.

Patterns of thin film 105-a may be deposited on a surface of glass sheet 100-a. Similarly, patterns of thin film 105-b may be deposited on a surface of glass sheet 100-b. The thin film patterns may be used as conductive traces for carrying signals and may include transparent materials, such as indium tin oxide (ITO). Alternatively or additionally, the thin film patterns may be used as an anti-reflective layer to minimize reflection off the glass sheet surface and may include anti-reflective material. Alternatively or additionally, the thin film patterns may be used as a protective layer and may include ceramic material or any other material with similar protective properties. The type of thin film used may depend on the ultimate use of the fabricated thin glass sheet.

Figure 1B:
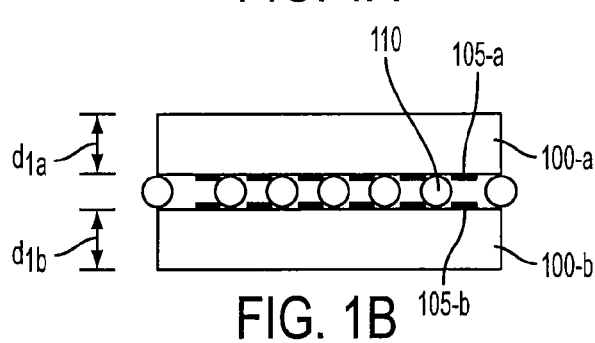
FIG. 1b illustrates an exemplary pair of thick glass sheets which are sealed together with their patterned surfaces facing each other and separated by spacers to form a sandwich according to embodiments of the invention.

FIG. 1b illustrates an exemplary pair of thick glass sheets which are sealed together with their patterned surfaces facing each other and separated by spacers to form a sandwich according to embodiments of the invention. In the example of FIG. 1b, thick glass sheets 100-a and 100-b of FIG. 1a, for example, may be temporarily joined together at their edges using any known method for doing so. For example, the edges of glass sheets 100-a and 100-b may be laminated together using any known laminate. Glass sheets 100-a and 100-b may be joined together with their patterned surfaces facing each other. Removable spacers 110 may be placed between the patterned surfaces to keep them apart. Spacers 110 may include any material that can maintain space between glass sheets 100-a and 100-b and that does not interact with the glass sheets and patterns 105-a and 105-b. Alternatively, a removable sealant may be placed between the patterned surfaces to keep them apart.

Figure 1C:
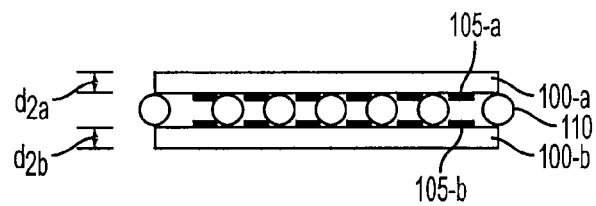
FIG. 1c illustrates an exemplary sandwich of patterned glass sheets which has been thinned on outside surfaces according to embodiments of the invention.

FIG. 1c illustrates an exemplary sandwich of patterned glass sheets which have been thinned on outside surfaces according to embodiments of the invention. In the example of FIG. 1c, thick glass sheets 100-a and 100-b of FIG. 1b, for example, that are sandwiched together may be thinned from respective thicknesses of $d_{1a}$ and $d_{1b}$ to thicknesses of $d_{2a}$ and $d_{2b}$, where $d_{2a} < d_{1a}$ and $d_{2b} < d_{1b}$. For example, conventional thick glass sheets having thicknesses of 0.5 mm or more each may be thinned to thicknesses of less than 0.5 mm each. The thinning process may include chemical etching, mechanical polishing, a combination of the two, and any other known methods for thinning glass sheets. One or both outside surfaces of the sandwich, i.e., the surfaces of glass sheets 100-a and 100-b opposite the patterned surfaces, may be thinned. Since patterns 105-a and 105-b may be sealed within the sandwich on inside surfaces, the patterns may be protected from deformation or damage during the thinning process. As a result of the thinning process, each glass sheet 100-a and 100-b can have a thickness less than the minimum thickness requirement of 0.5 mm for standard LCD equipment; while the sandwich of the glass sheets maintains a thickness at or above the requirement.

Figure 1D:
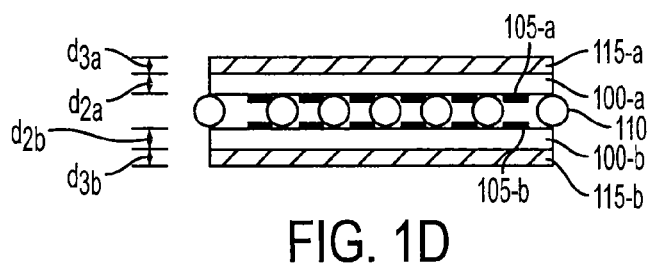
FIG. 1d illustrates an exemplary sandwich of thin patterned glass sheets which has been coated with thin film on outside surfaces according to embodiments of the invention.

FIG. 1d illustrates an exemplary sandwich of thin patterned glass sheets which have been coated with thin film on outside surfaces according to embodiments of the invention. In the example of FIG. 1d, the thinned outside surfaces of the sandwich of thin glass sheets 100-a and 100-b of FIG. 1c, for example, may be coated with additional thin film material. Thin film coating 115-a may coat the thinned surface of glass sheet 100-a with a coating layer thickness of $d_{3a}$. Thin film coating 115-b may coat the thinned surface of glass sheet 100-b with a coating layer thickness of $d_{3b}$. The thin film material used to coat the thinned outside surfaces of the sandwich of thin glass sheets 100-a and 100-b may be similar to the thin film material used to form patterns 105-a and 105-b described above. This can provide double thin filming—the thin film pattern on one surface and the thin film coating on the opposite surface. This coating may be either a complete layer or just a pattern, depending on the particular implementation for the glass sheets. Alternatively, this coating may be optional, thereby providing single thin filming—the thin film pattern on one surface.

Figure 1E:
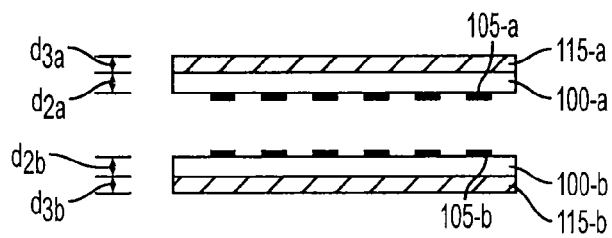
FIG. 1e illustrates an exemplary pair of thin glass sheets which are coated with thin film on one surface and patterned with thin film on the opposite surface according to embodiments of the invention.

FIG. 1e illustrates an exemplary pair of thin glass sheets which are coated with thin film on one surface and patterned with thin film on the opposite surface according to embodiments of the invention. In the example of FIG. 1e, the sandwich of thin glass sheets 100-a and 100-b of FIG. 1d, for example, may be separated to form separate sheets. Thin glass sheet 100-a may have a thin film layer 115-a on one surface and a thin film pattern 105-a on the opposite surface, where the glass sheet may have a thickness of less than 0.5 mm. Similarly, thin glass sheet 100-b may have a thin film layer 115-b on one surface and a thin film pattern 105-b on the opposite surface, where the glass sheet may have a thickness of less than 0.5 mm. Here, both sheets 100-a and 100-b may have thicknesses less than the minimum thickness requirement for standard LCD equipment, yet have been fabricated using that same equipment.

To separate the sandwich to form separate thin glass sheets 100-a and 100-b, the sealed edges of the sheets may be cut from the sandwich and spacers 110 removed. Other mechanical methods may be used to separate the glass sheets. Alternatively, chemical methods may be used, e.g., delamination to remove a laminate that formed the seal. A combination of mechanical and chemical methods may also be used.

In an example, as shown in FIGS. 1a-1e, two thick sheets of glass, each having a thickness of about 0.5 mm could be joined to form a sandwich having a thickness of about 1.0 mm. The sandwich could be thinned to a thickness of about 0.6 mm. After the sandwich is separated, each glass sheet could have a thickness of about 0.3 mm, which would be well below the minimum thickness requirement of standard LCD equipment.

It is to be understood that the thickness of a thin glass sheet is not limited to that described here, but may include any thickness below the minimum thickness requirement of the LCD equipment that may be suitable for touch sensor panels or other devices.

Figure 2:
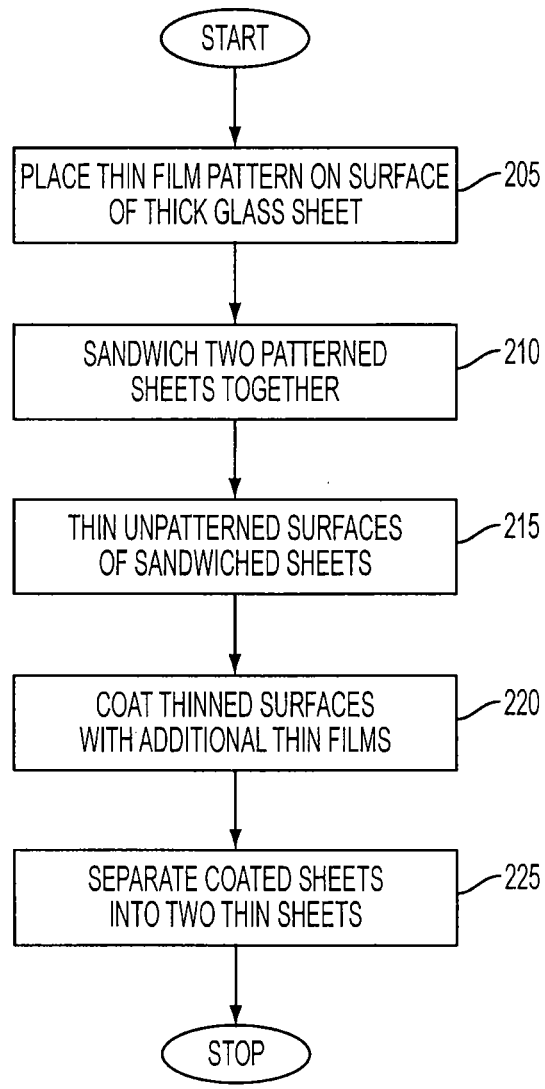
FIG. 2 illustrates an exemplary method for fabricating a pair of thin glass sheets according to embodiments of the invention.

FIG. 2 illustrates an exemplary method for fabricating a pair of thin glass sheets according to embodiments of the invention. Optionally using standard LCD technology, a standard LCD thin film deposition tool may be used to place a thin film pattern on a surface of a thick glass sheet (205). The thick glass sheets may have a thickness of 0.5 mm or more each to meet the minimum thickness requirement of standard LCD equipment. This deposition may be repeated for multiple sheets. A standard LCD sealing tool may be used to join a pair of the patterned thick glass sheets together to form a sandwich, with the patterned surfaces facing each other and with removable spacers placed between the patterned surfaces (210). The sandwich may have a thickness of 1.0 mm or more, which also meets the minimum thickness requirement of standard LCD equipment. A standard LCD thinning tool may be used to thin one or both outside surfaces of the sandwich, where the thicknesses of one or both glass sheets may each be thinned to less than 0.5 mm (215). Here, the thinned sandwich may have a thickness of 0.5 mm or more, depending on how thin the sheets are fabricated, which still meets the minimum thickness requirement of standard LCD equipment. The standard LCD thin film deposition tool may be used again to coat the thinned outside surface of the sandwich (220) to complete the standard LCD fabrication process.

After completing the standard LCD fabrication process, unlike LCD panels, the sandwich of thin glass sheets may now be separated into separate glass sheets. Any suitable unsealing tool known to those skilled in the art may be used to separate the pair of patterned thin glass sheets into separate glass sheets (225). The resulting thin glass sheet or sheets may have a thickness of less than 0.5 mm, which is below the minimum thickness requirement of standard LCD equipment, yet still advantageously have been fabricated using that equipment.

Figure 3A:
FIG. 3a illustrates an exemplary thick glass sheet patterned with thin film on a surface according to embodiments of the invention.

FIG. 3a illustrates an exemplary thick glass sheet patterned with thin film on a surface according to embodiments of the invention. In the example of FIG. 3a, thick glass sheet 300 may have a thickness of $d_1$. Conventional thick glass sheets may typically be 0.5 mm or greater in thickness.

Patterns of thin film 305 may be deposited on a surface of glass sheet 300. As mentioned previously, the thin film patterns may be used as conductive traces for carrying a signal and may include semiconductor materials. Alternatively or additionally, the thin film patterns may be used as an anti-reflective layer to minimize reflection off the glass sheet surface and may include anti-reflective material. Alternatively or additionally, the thin film patterns may be used as a protective layer and may include ceramic, organic, or any other materials with such protective properties.

Figure 3B:
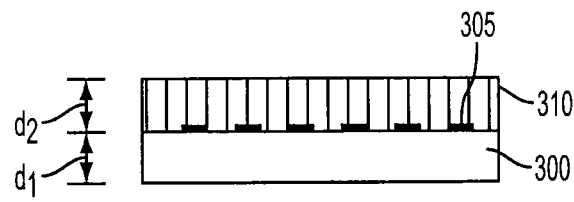
FIG. 3b illustrates an exemplary thick glass sheet patterned with thin film on a surface and with a protective layer of material overlaying the thin film pattern according to embodiments of the invention.

FIG. 3b illustrates an exemplary thick glass sheet patterned with thin film on a surface and with a protective layer of material overlaying the thin film pattern according to embodiments of the invention. In the example of FIG. 3b, thick glass sheet 300 of FIG. 3a, for example, may have removable protective layer 310 of thickness $d_2$ overlaying patterns 305 on the surface of the thick glass sheet. Protective layer 310 may be any material that is capable of withstanding the standard LCD fabrication equipment and that does not interact with glass sheet 300 and patterns 305. The thickness of protective layer 310 may be any value that would ensure that the combined layer and sheet meets the minimum thickness requirement of the standard LCD equipment. For example, the thickness $d_2$ may be 0.5 mm or more. Protective layer 310 may protect patterns 305 from deformation or damage during the fabrication process.

Figure 3C:
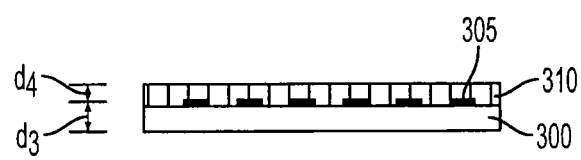
FIG. 3c illustrates an exemplary thick glass sheet patterned with thin film on a surface and with a protective layer of material overlaying the thin film pattern, where the outside surfaces of the sheet and the layer have been thinned according to embodiments of the invention.

FIG. 3c illustrates an exemplary thick glass sheet patterned with thin film on a surface and with a protective layer of material overlaying the thin film pattern, where the outside surfaces of the sheet and the layer have been thinned according to embodiments of the invention. In the example of FIG. 3c, thick glass sheet 300 of FIG. 3b, for example, may be thinned from a thickness of $d_1$ to a thickness of $d_3$, where $d_3<d_1$. The surface of glass sheet 300 opposite the surface having protective layer 310 may be thinned. For example, conventional thick glass sheets having thicknesses of 0.5 mm or more each may be thinned to thicknesses of less than 0.5 mm each. The thinning process may include chemical etching, mechanical polishing, a combination of the two, and any other known methods for thinning glass sheets. Optionally, protective layer 310 may also be thinned concurrently with glass sheet 300 from a thickness of $d_2$ to a thickness of $d_4$, where $d_4<d_2$. Glass sheet 300 can have a thickness less than the minimum thickness requirement of 0.5 mm for standard LCD equipment; while the combined sheet 300 and layer 310 maintains a thickness at or above the requirement.

Figure 3D:
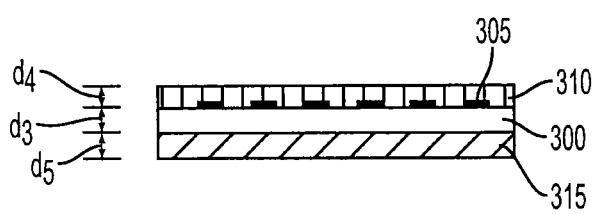
FIG. 3d illustrates an exemplary thin patterned glass sheet with a thin protective layer of material thereon, where the sheet has been coated with thin film on the outside surface according to embodiments of the invention.

FIG. 3d illustrates an exemplary thin patterned glass sheet with a thin protective layer of material thereon, where the sheet has been coated with thin film on the outside surface of the sheet according to embodiments of the invention. In the example of FIG. 3d, the thinned outside surface of thin glass sheet 300 of FIG. 3c, for example, may be coated with additional thin film material. Thin film coating 315 may coat the thinned surface of glass sheet 300 with a coating layer thickness of $d_5$. The thin film material used to coat the thinned outside surface of thin glass sheet 300 may be similar to the thin film material used to form patterns 305 described above. This may provide double thin filming—the thin film pattern on one surface and the thin film coating on the opposite surface. This coating may be either a complete layer or just a pattern, depending on the particular implementation for the glass sheet. Alternatively, this coating may be optional, thereby providing single thin filming—the thin film pattern on one surface.

Figure 3E:
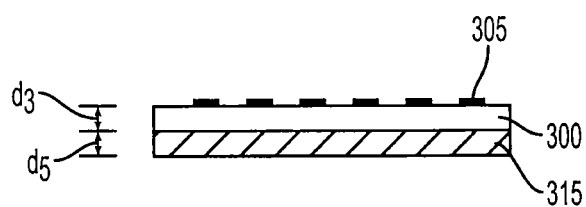
FIG. 3e illustrates an exemplary thin glass sheet which is coated with thin film on a surface and patterned with thin film on the opposite surface according to embodiments of the invention.

FIG. 3e illustrates an exemplary thin glass sheet which is coated with thin film on a surface and patterned with thin film on the opposite surface according to embodiments of the invention. In the example of FIG. 3e, protective layer 310 on thin glass sheet 300 of FIG. 3d, for example, may be removed, leaving the thin glass sheet remaining. To remove protective layer 310 from thin glass sheet 300, any suitable chemical or mechanical method known to those skilled in the art, or combination thereof, may be used that is capable of removing such a layer. Thin glass sheet 300 may have a thin film layer 315 on one surface and a thin film pattern 305 on the opposite surface, where the glass sheet may have a thickness of less than 0.5 mm. Here, sheet 300 may have a thickness less than the minimum thickness requirement for standard LCD equipment, yet have been fabricated using that same equipment.

In an example, as shown in FIGS. 3a-3e, a thick sheet of glass having a thickness of about 0.5 mm could have a protective layer having a similar thickness applied on a surface of the glass to form a combination having a thickness of about 1.0 mm. The glass sheet could be thinned so that the combination has a thickness of about 0.7 mm. Alternatively, the protective layer could concurrently be thinned so that the combination has a thickness of about 0.6 mm. After the protective layer is removed, the glass sheet could have a thickness of about 0.2 mm, which is well below the minimum thickness requirement of standard LCD equipment.

It is to be understood that the thickness of a thin glass sheet is not limited to that described here, but may include any thickness below the minimum thickness requirement of the LCD equipment that may be suitable for touch sensor panels.

Figure 4:
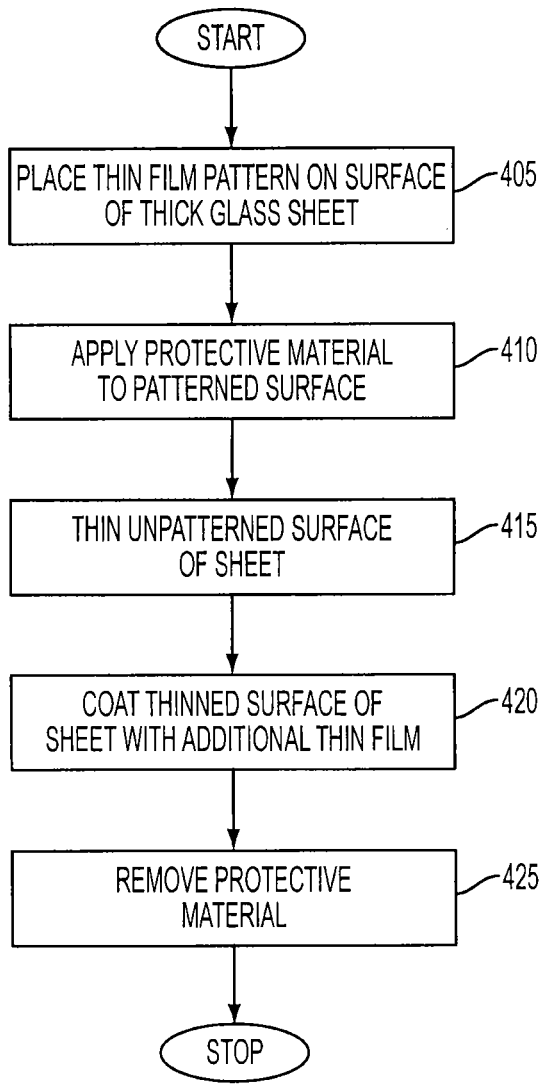
FIG. 4 illustrates an exemplary method for fabricating a thin glass sheet according to embodiments of the invention.

FIG. 4 illustrates an exemplary method for fabricating a thin glass sheet according to embodiments of the invention. Optionally using standard LCD technology, a standard LCD thin film deposition tool may be used to place a thin film pattern on a surface of a thick glass sheet (405). The thick glass sheet may have a thickness of 0.5 mm or more to meet the minimum thickness requirement of standard LCD equipment. A standard LCD material deposition tool may be used to apply a protective layer overlaying the patterns on a surface of the thick glass sheet (410). The combined sheet and layer may have a thickness of more than 0.5 mm, which also meets the minimum thickness requirement of standard LCD equipment. A standard LCD thinning tool may be used to thin the surface of the glass sheet opposite the surface having the protective layer, where the thicknesses of the glass sheet may be thinned to less than 0.5 mm (415). Optionally, the protective layer may also be thinned. The combination of the thinned sheet and layer may maintain a thickness of 0.5 mm or more, which still meets the minimum thickness requirement of standard LCD equipment. The standard LCD thin film deposition tool may be used again to coat the thinned outside surface of the sheet (420) to complete the standard LCD fabrication process.

After completing the standard LCD fabrication process, the protective layer may be removed from the surface of the glass sheet. Any suitable removal tool known to those skilled in the art may be used to do so, leaving the thin glass sheet remaining (425). The resulting thin glass sheet may have a thickness of less than 0.5 mm, which is below the minimum thickness requirement of standard LCD equipment, yet still advantageously have been fabricated using that equipment.

Figure 5A:
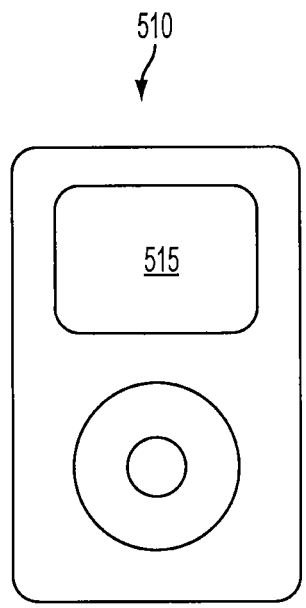
FIG. 5a illustrates an exemplary digital media player having a touch sensor panel that includes a thin glass sheet according to embodiments of the invention.

FIG. 5a illustrates exemplary digital media player 510 that can include touch sensor panel 515, the touch sensor panel including a thin glass sheet having a thickness of less than 0.5 mm according to embodiments of the invention.

Figure 5B:
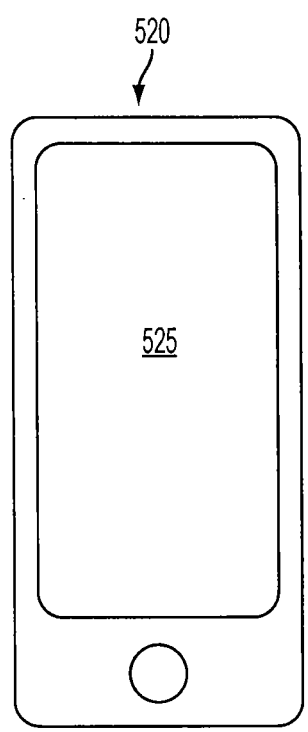
FIG. 5b illustrates an exemplary mobile telephone having a touch sensor panel that includes a thin glass sheet according to embodiments of the invention.

FIG. 5b illustrates exemplary mobile telephone 520 that can include touch sensor panel 525, the touch sensor panel including a thin glass sheet having a thickness of less than 0.5 mm according to embodiments of the invention.

The media player and the mobile telephone of FIGS. 5a and 5b can achieve lighter weights utilizing thin glass sheets according to embodiments of the invention.

Figure 6:
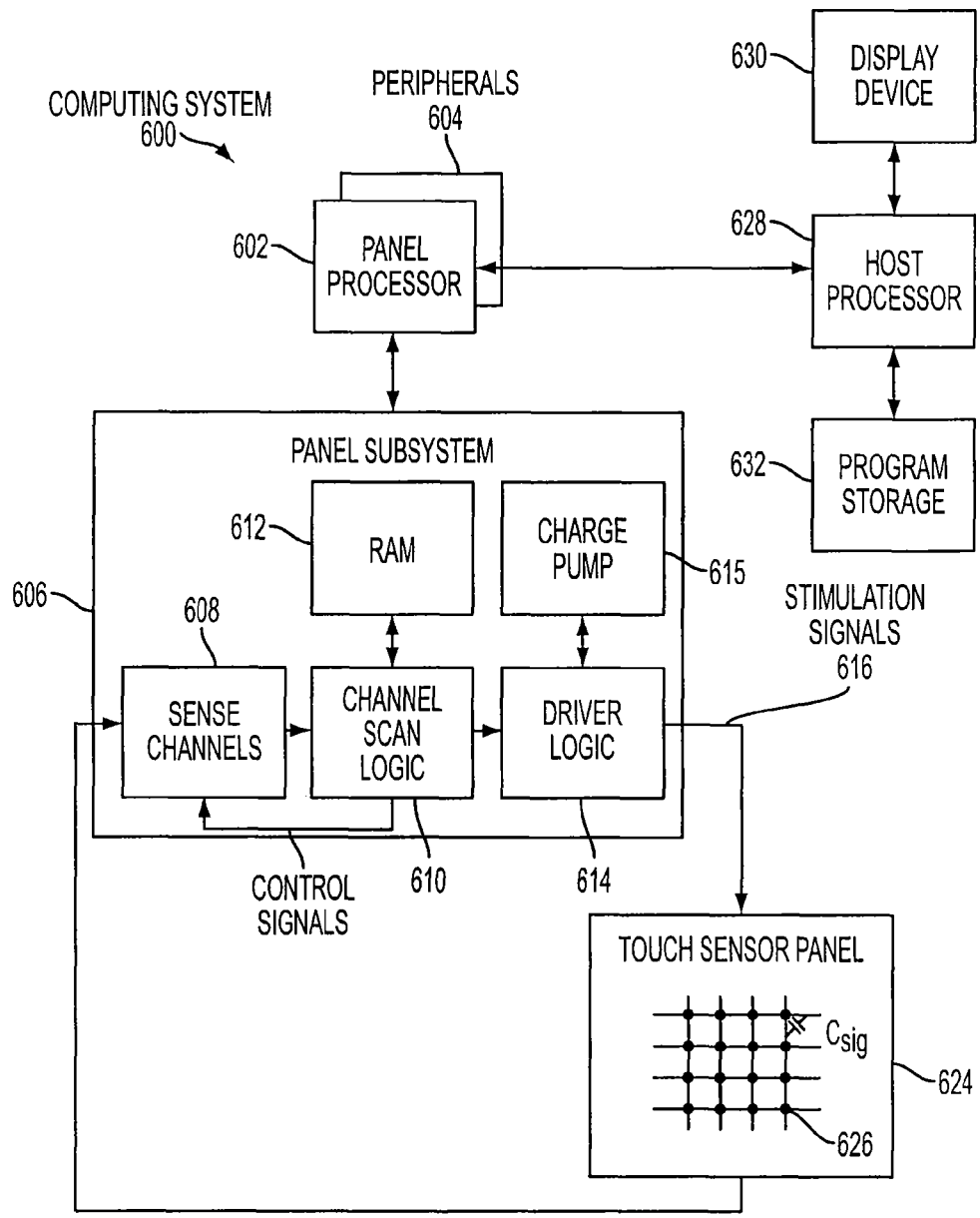
FIG. 6 illustrates an exemplary computing system including a touch sensor panel utilizing a thin glass sheet according to embodiments of the invention.

FIG. 6 illustrates exemplary computing system 600 that can include one or more of the embodiments of the invention described above. Computing system 600 can include one or more panel processors 602 and peripherals 604, and panel subsystem 606. Peripherals 604 can include, but are not limited to, random access memory (RAM) or other types of memory or storage, watchdog timers and the like. Panel subsystem 606 can include, but is not limited to, one or more sense channels 608, channel scan logic 610 and driver logic 614. Channel scan logic 610 can access RAM 612, autonomously read data from the sense channels and provide control for the sense channels. In addition, channel scan logic 610 can control driver logic 614 to generate stimulation signals 616 at various frequencies and phases that can be selectively applied to drive lines of touch sensor panel 624. In some embodiments, panel subsystem 606, panel processor 602 and peripherals 604 can be integrated into a single application specific integrated circuit (ASIC).

Touch sensor panel 624 can include a capacitive sensing medium having a plurality of drive lines and a plurality of sense lines, although other sensing media can also be used. Either or both of the drive and sense lines can be coupled to a thin glass sheet according to embodiments of the invention. Each intersection of drive and sense lines can represent a capacitive sensing node and can be viewed as picture element (pixel) 626, which can be particularly useful when touch sensor panel 624 is viewed as capturing an "image" of touch. (In other words, after panel subsystem 606 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) Each sense line of touch sensor panel 624 can drive sense channel 608 (also referred to herein as an event detection and demodulation circuit) in panel subsystem 606.

Computing system 600 can also include host processor 628 for receiving outputs from panel processor 602 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 628 can also perform additional functions that may not be related to panel processing, and can be coupled to program storage 632 and display device 630 such as an LCD panel for providing a UI to a user of the device. Display device 630 together with touch sensor panel 624, when located partially or entirely under the touch sensor panel, can form touch screen 618.

Note that one or more of the functions described above can be performed by firmware stored in memory (e.g. one of the peripherals 604 in FIG. 6) and executed by panel processor 602, or stored in program storage 632 and executed by host processor 628. The firmware can also be stored and/or transported within any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any medium that can contain or store the program for use by or in connection with the instruction execution system, apparatus, or device. The computer readable medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Although the invention has been fully described in connection with embodiments thereof with reference to the accompanying drawings, it is to be noted that various changes and modifications will become apparent to those skilled in the art. Such changes and modifications are to be understood as being included within the scope of the invention as defined by the appended claims.

What is claimed is:

1. A method for fabricating thin sheets of glass, comprising:
   providing a first sheet of glass having a first thickness;
   providing a second sheet of glass having a second thickness;
   patterning a first layer of thin film on a surface of the first sheet of glass;
   patterning a second layer of thin film on a surface of the second sheet of glass;
   providing a plurality of spacers between the first and second sheets of glass;
   joining the first and second sheets of glass together with the patterned first and second layers of thin film facing each other and the spacers distributed between facing surfaces of the first and second sheets of glass along border and interior regions thereof;
   thinning at least one of the first and second sheets of glass on a side opposite the patterning; and
   separating the first and second sheets of glass from each other.

2. The method of claim 1, wherein at least one of the first and second thicknesses is 0.5 mm or greater prior to the thinning.

3. The method of claim 1, further comprising:
   forming a third layer of thin film on a surface of the first sheet of glass after thinning, the third layer formed as a complete, unpatterned layer of the same material used in forming the patterned first or second layers.

4. The method of claim 1, wherein the joining comprises sealing the edges of the first and second sheets of glass together.

5. The method of claim 1, wherein the thinning comprises thinning the at least one of the first and second sheets to less than 0.5 mm.

6. The method of claim 1, wherein the thinning comprises at least one of chemical etching and mechanical polishing.

7. The method of claim 3, further comprising:
   after thinning, forming a fourth layer of thin film on a surface of the second sheet of glass the fourth layer being a complete, unpatterned layer of the same material used in forming the first or second layers.

8. The method of claim 1, wherein the separating comprises unsealing sealed-together edges of the first and second sheets of glass.

9. The method of claim 1, wherein the separating comprises removing spacers forming space between the first and second sheets of glass.

* * * * *